United States Patent
Reboh et al.

(10) Patent No.: US 11,769,687 B2
(45) Date of Patent: Sep. 26, 2023

(54) METHOD FOR LAYER TRANSFER WITH LOCALISED REDUCTION OF A CAPACITY TO INITIATE A FRACTURE

(71) Applicant: COMMISSARIAT À L'ÉNERGIE ATOMIQUE ET AUX ÉNERGIES ALTERNATIVES, Paris (FR)

(72) Inventors: Shay Reboh, Grenoble (FR); Frédéric Mazen, Grenoble (FR); Pablo Acosta Alba, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 45 days.

(21) Appl. No.: 16/733,006

(22) Filed: Jan. 2, 2020

(65) Prior Publication Data
US 2020/0219762 A1 Jul. 9, 2020

(30) Foreign Application Priority Data
Jan. 7, 2019 (FR) ...................................... 1900127

(51) Int. Cl.
*H01L 21/762* (2006.01)
(52) U.S. Cl.
CPC .............................. *H01L 21/76254* (2013.01)
(58) Field of Classification Search
CPC ..................................... H01L 21/76251–76254
See application file for complete search history.

(56) References Cited

U.S. PATENT DOCUMENTS

| | | | |
|---|---|---|---|
| 6,403,450 B1* | 6/2002 | Maleville | H01L 21/76254 438/455 |
| 10,205,021 B1 | 2/2019 | Reboh | |
| 10,263,077 B1 | 4/2019 | Reboh et al. | |
| 2003/0077885 A1* | 4/2003 | Aspar | H01L 21/76254 438/517 |
| 2005/0221583 A1* | 10/2005 | Aspar | H01L 21/76254 257/E21.568 |

(Continued)

FOREIGN PATENT DOCUMENTS

| | | |
|---|---|---|
| WO | 2018029419 A1 | 2/2018 |
| WO | 2018149906 A1 | 8/2018 |

OTHER PUBLICATIONS

Search Report for French Application No. 1900127 dated Jun. 12, 2019.

(Continued)

*Primary Examiner* — Mohsen Ahmadi
(74) *Attorney, Agent, or Firm* — Pearne & Gordon LLP

(57) ABSTRACT

A method for transferring a thin layer from a donor substrate to a receiver substrate including the steps of implantation of species carried out in a uniform manner on the whole of the donor substrate to form therein an embrittlement plane which delimits the thin layer and a bulk part of the donor substrate, of placing in contact the donor substrate and the receiver substrate and of initiating and propagating a fracture wave along the embrittlement plane. The method comprises, before the placing in contact, a step of localised reduction of a capacity of the embrittlement plane to initiate the fracture wave. This step of localised reduction may be carried out by means of a localised laser annealing of the donor substrate.

12 Claims, 5 Drawing Sheets

(56) References Cited

U.S. PATENT DOCUMENTS

| | | | |
|---|---|---|---|
| 2007/0023867 A1* | 2/2007 | Aulnette | H01L 21/76254 257/618 |
| 2007/0037363 A1* | 2/2007 | Aspar | H01L 21/76254 438/459 |
| 2007/0210307 A1* | 9/2007 | Hebras | H01L 21/76254 257/75 |
| 2008/0064182 A1* | 3/2008 | Hebras | H01L 21/76254 438/455 |
| 2009/0035920 A1* | 2/2009 | Neyret | H01L 21/76254 438/458 |
| 2009/0038758 A1* | 2/2009 | Legros | H01L 21/187 156/718 |
| 2010/0052092 A1* | 3/2010 | Capello | H01L 21/76254 257/506 |
| 2011/0207295 A1* | 8/2011 | Landru | H01L 21/76251 438/459 |
| 2012/0223419 A1* | 9/2012 | Kerdiles | H01L 21/76251 257/637 |
| 2012/0319121 A1* | 12/2012 | Reynaud | H01L 21/76254 257/66 |
| 2013/0005122 A1* | 1/2013 | Schwarzenbach | H01L 21/76251 438/479 |
| 2014/0113434 A1* | 4/2014 | Tauzin | H01L 21/76254 438/458 |
| 2015/0044828 A1 | 2/2015 | Batude et al. | |
| 2015/0155170 A1 | 6/2015 | Reboh et al. | |
| 2015/0179474 A1 | 6/2015 | Maitrejean et al. | |
| 2015/0179665 A1 | 6/2015 | Reboh et al. | |
| 2016/0005862 A1 | 1/2016 | Reboh et al. | |
| 2016/0020153 A1 | 1/2016 | Batude et al. | |
| 2016/0149037 A1 | 5/2016 | Reboh et al. | |
| 2016/0149039 A1 | 5/2016 | Reboh et al. | |
| 2016/0233125 A1* | 8/2016 | Landru | H01L 21/76254 |
| 2016/0276494 A1 | 9/2016 | Barraud et al. | |
| 2016/0293989 A1* | 10/2016 | Ghyselen | H01M 4/88 |
| 2016/0300927 A1 | 10/2016 | Reboh et al. | |
| 2017/0076944 A1 | 3/2017 | Augendre et al. | |
| 2017/0076997 A1 | 3/2017 | Reboh et al. | |
| 2017/0263607 A1 | 9/2017 | Maitrejean et al. | |
| 2017/0309483 A1 | 10/2017 | Reboh et al. | |
| 2017/0345915 A1 | 11/2017 | Coquand et al. | |
| 2017/0345931 A1 | 11/2017 | Reboh et al. | |
| 2017/0358459 A1 | 12/2017 | Reboh et al. | |
| 2018/0082837 A1 | 3/2018 | Reboh et al. | |
| 2018/0175163 A1 | 6/2018 | Barraud et al. | |
| 2018/0175166 A1 | 6/2018 | Reboh et al. | |
| 2018/0175167 A1 | 6/2018 | Reboh et al. | |
| 2018/0175194 A1 | 6/2018 | Reboh et al. | |
| 2019/0051744 A1 | 2/2019 | Coquand et al. | |
| 2019/0074215 A1* | 3/2019 | Ecarnot | H01L 21/02532 |
| 2019/0198614 A1 | 6/2019 | Reboh et al. | |
| 2019/0198616 A1 | 6/2019 | Coquand et al. | |
| 2019/0202688 A1* | 7/2019 | Benaissa | B81C 1/00507 |
| 2020/0058768 A1 | 2/2020 | Coquand et al. | |

OTHER PUBLICATIONS

Specification and drawings for U.S. Appl. No. 16/590,557 entitled "Structure With Superimposed Semiconductor Bars Having a Uniform Semiconductor Casing".

Specification and drawings for U.S. Appl. No. 16/580,396 entitled "A Method for Makin Superimposed Transistors".

* cited by examiner

METHOD FOR LAYER TRANSFER WITH LOCALISED REDUCTION OF A CAPACITY TO INITIATE A FRACTURE

CROSS-REFERENCE TO RELATED APPLICATIONS

This application claims priority from French Patent Application No. 19 00127 filed on Jan. 7, 2019. The content of this application is incorporated herein by reference in its entirety.

TECHNICAL FIELD

The field of the invention is that of methods for transferring a layer from a donor substrate to a receiver substrate which implement a fracturing along an embrittlement plane formed in the donor substrate. The invention more particularly relates to the control of the fracturing process.

PRIOR ART

Smart Cut™ technology is a well-known technique being for enabling the transfer of thin layers of materials, for example semiconductor materials. According to this technique, ionic species such as hydrogen or helium are implanted in a donor substrate in order to form therein an embrittlement plane. The donor substrate is thereafter placed in contact with a receiver substrate, for example by direct bonding. This technique next resorts to the development of defects generated during the implantation to lead to fracturing. This development involves an energy input, generally achieved by means of a thermal treatment, in order to enable the formation of a confined layer of cavities and microfissures within which a fracture wave is going to initiate and propagate. This wave is going to progressively extend all along the embrittlement plane leading to the separation of the superficial thin layer delimited by this embrittlement plane and the remainder of the substrate.

The document WO 2018/029419 A1 discloses that the interaction between the propagation of the fracture wave and acoustic vibrations emitted during the initiation and/or the propagation of the fracture wave leads to the formation of periodic patterns of variations in thickness and/or roughness of the transferred layer, which extend over the whole surface of this layer. In other words, the fracture wave is deviated vertically from its progression plane according to the instantaneous stress state of the material that it traverses, this stress state being influenced by the acoustic wave.

The absence of precise control of the localisation of the initiation of the fracture wave leads to a variability between transferred thin layers, notably in terms of roughness and/or thickness, a variability which necessitates the implementation of more stringent controls and/or specific post-fracture treatments.

In order to limit this variability, it is thus sought to initiate the fracture wave in a standardised manner. In the document WO 2018/029419 A1 cited previously, for this purpose zones are created, localised on the wafer, where the fracture preferentially initiates. Such a creation may notably consist in:

carrying out a localised overdosing in a target zone of the species implanted during the formation of the embrittlement plane in the donor substrate; or instead applying a localised thermal budget surplus in a target zone of the species implanted during the formation of the embrittlement plane to grow the defects more rapidly in this zone of the embrittlement plane.

DESCRIPTION OF THE INVENTION

The invention proposes a complementary or alternative technique to the aforementioned techniques of confinement of the localisation of the initiation of the fracture wave in a target zone of the embrittlement plane. More particularly, it relates to a method for transferring a thin layer from a donor substrate to a receiver substrate, the donor substrate comprising an embrittlement plane delimiting the thin layer and a bulk part of the donor substrate, the method including the following steps:
  implantation of species carried out in a uniform manner on the whole of the donor substrate to form therein an embrittlement plane which delimits the thin layer and a bulk part of the donor substrate,
  placing in contact the donor substrate and the receiver substrate,
  initiating and propagating a fracture wave along the embrittlement plane.

This method further includes, before the placing in contact, a step of localised reduction of a capacity of the embrittlement plane to initiate the fracture wave.

Certain preferred but non-limiting aspects of this method are the following:
  during the step of localised reduction of the capacity of the embrittlement plane to initiate the fracture wave, a central zone of the embrittlement plane is not subjected to the reduction of the capacity to initiate the fracture wave;
  during the step of localised reduction of the capacity of the embrittlement plane to initiate the fracture wave, a peripheral crown of the embrittlement plane is subjected to the reduction of the capacity to initiate the fracture wave;
  during the step of localised reduction of the capacity of the embrittlement plane to initiate the fracture wave, a peripheral crown of the embrittlement plane, with the exception of a sector of the peripheral crown, is subjected to the reduction of the capacity to initiate the fracture wave;
  the initiation of the fracture wave includes a localised input of energy at the level of the sector of the peripheral crown not subjected to the reduction of the capacity to initiate the fracture wave;
  the peripheral crown is localised at the edge of the embrittlement plane;
  the step of localised reduction of the capacity of the embrittlement plane to initiate the fracture wave includes the carrying out of a localised laser annealing of the donor substrate;
  the carrying out of the localised laser annealing of the donor substrate includes a localised irradiation of a free face of the thin layer by one or more laser pulses;
  the step of localised reduction of the capacity of the embrittlement plane to initiate the fracture wave includes the formation of a localised amorphous zone in the thin layer;
  the amorphous zone is localised at less than 100 nm, preferably at less than 75 nm, and even more preferably at less than 50 nm from the embrittlement plane.

BRIEF DESCRIPTION OF THE DRAWINGS

Other aspects, aims, advantages and characteristics of the invention will become clearer on reading the following detailed description of preferred embodiments thereof, given as a non-limiting example, and made with reference to the appended drawings in which.

DETAILED DESCRIPTION

The invention relates to a method for transferring a thin layer from a donor substrate to a receiver substrate. The donor substrate may be a silicon substrate, or be made of any other material, semiconductor or not. As examples, it may be silicon-germanium, germanium or a III-V material.

Figure 8A:
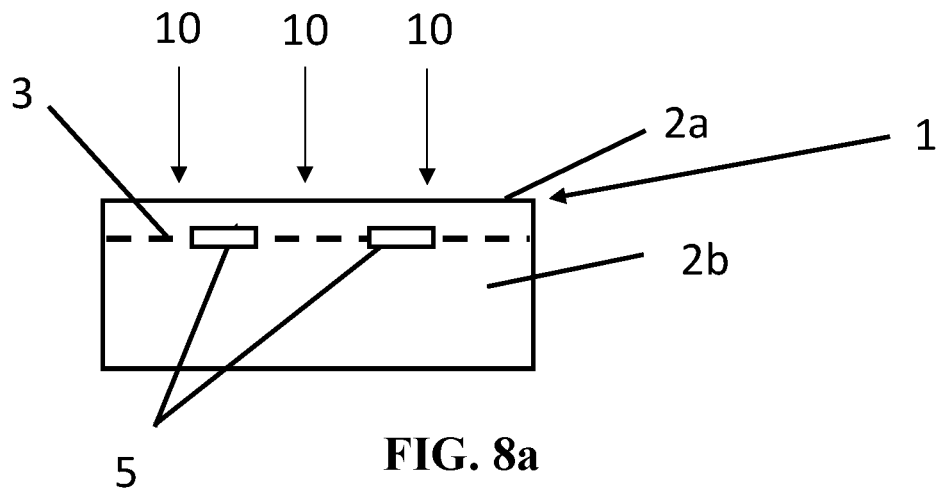
FIG. 8a represents a schematic view of a donor substrate with implanting species.
Figure 8B:
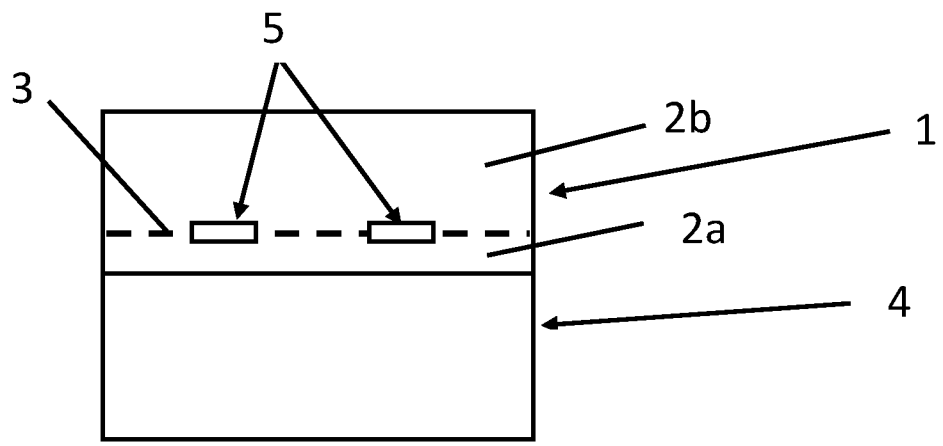
FIG. 8b represents a schematic view of the donor substrate of FIG. 8a adjacent a receiver substrate.
Figure 8C:
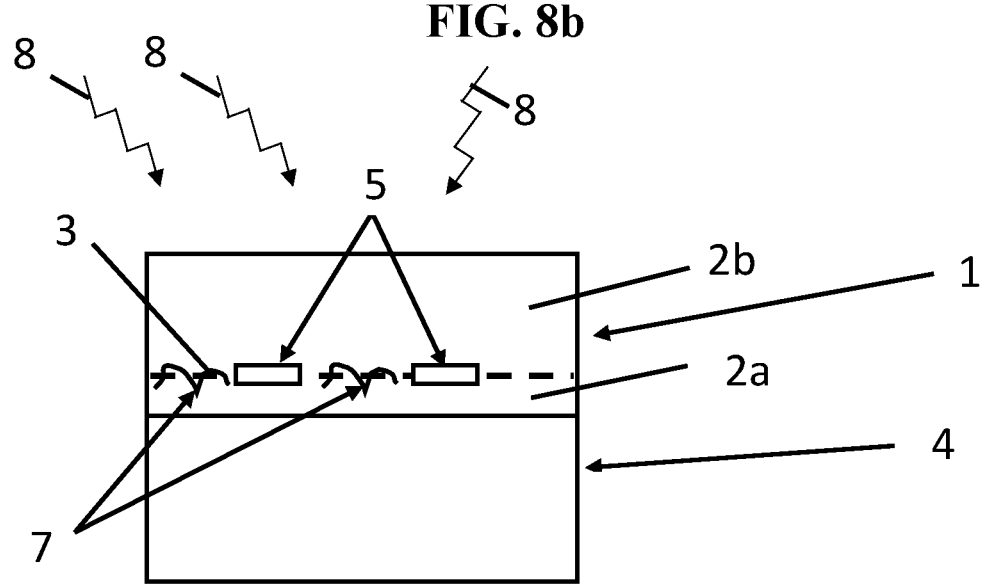
FIG. 8c represents a schematic view of the donor substrate and the receiver substrate of FIG. 8b with a fracture wave initiated.

The method includes a step of formation in the donor substrate 1 of an embrittlement plane 3 delimiting the thin layer 2a and a bulk part 2b of the donor substrate 1. See, FIG. 8a. This embrittlement plane 3 is formed by implantation of species 10, typically hydrogen and/or helium, carried out in a uniform manner (notably in dose) on the whole of the donor substrate 1. Thus, the dose of implanted species 10 is uniform over the whole extent of the embrittlement plane 3 and the embrittlement plane 3 has a uniform capacity to initiate a fracture wave 7 (FIG. 8c) over its whole extent.

The method includes the placing in contact of the donor substrate 1 and the receiver substrate 4 to form an assembly to fracture. See, FIG. 8b. This formation may be carried out by direct assembly, for example by molecular adhesion. Then, following the placing in contact, the method includes the initiation and the propagation of the fracture wave 7 (FIG. 8c) along the embrittlement plane 3, which leads to the detachment of the thin layer 2a from the donor substrate 1 and to its transfer onto the receiver substrate 4. This initiation and propagation of the fracture wave 7 includes a so-called embrittlement thermal treatment (represented by arrows 8) applied to the assembly to fracture. This thermal treatment embrittles the donor substrate 1 at the level of its embrittlement plane 3, and supplies sufficient energy so that the fracture wave 7, once initiated, propagates in a self-sustaining manner.

In a first alternative embodiment, the thermal treatment is sufficient on its own to initiate the fracture wave. In a second alternative embodiment, the method includes an additional localised energy input, after or during the embrittlement thermal treatment, to initiate the fracture wave. This energy may be of mechanical or thermal origin or of any other origin. It may involve for example a localised heating carried out by a laser, or an input of energy by ultrasounds.

According to the invention, the initiation of the fracture wave 7 (FIG. 8c) is spatially controlled by reducing, or even inhibiting, the capacity of one or more target zones 5 of the embrittlement plane 3 to initiate the fracture wave 7. To do so, the method includes, before the placing in contact of the donor substrate 1 and the receiver substrates 4, the application to the donor substrate 1 of a treatment of localised reduction of the capacity of the embrittlement plane 3 to initiate the fracture wave 7. This spatially selective reduction means that the initiation of the fracture wave 7 is localised in a region of the embrittlement plane 3 different from the target zone(s) 5 which have a probability of initiation of the fracture wave 7 made less by said treatment. And as will be detailed hereafter, in an embodiment, the localised reduction of the capacity to initiate the fracture wave 7 is carried out so as to reduce the probability of initiation of the fracture wave by a target zone 5 without this same target zone 5 forming an obstacle to the propagation of the fracture wave 7.

A methodology is described hereafter for determining the operating conditions of a treatment of the donor substrate making it possible to reduce or even to inhibit the capacity of a target zone of the embrittlement plane to initiate the fracture wave.

During a thermal treatment applied to an implanted substrate not assembled to a stiffener, the defects linked to the implantation evolve in the form of cavities which can be behind a blistering or even an exfoliation of the implanted layer. In the field of the invention, it is generally considered that the operating parameters leading to such a blistering/exfoliation of a non-assembled substrate are also going to make it possible to carry out the transfer of a thin layer when the substrate is assembled with a stiffener.

In a possible embodiment of the invention, the localised reduction of the capacity of the embrittlement plane to initiate the fracture wave may include the carrying out of a localised laser annealing of the donor substrate. The Inventors have actually been able to check that by locally irradiating an implanted substrate with a laser beam, it is possible to reduce or even to inhibit blistering/exfoliation phenomena in the irradiated zones whereas these phenomena are observed in a usual manner in the non-irradiated zones. The absence of blistering/exfoliation in the irradiated zones means that these zones cannot initiate a fracture wave.

The operating conditions of such localised laser annealing may be determined as described hereafter on the basis of an exemplary embodiment of the method according to the invention which uses a donor substrate made of silicon having an embrittlement plane formed by implantation of hydrogen and helium with energies in the range 30-40 keV and a total dose (H+He) of the order of $2.10^{16}$ ions/cm$^2$. The laser annealing is a laser annealing of the NSLA (Nano Second Laser Annealing) type exploiting to begin with a single irradiation pulse of wavelength 380 nm and of duration (full width at half maximum) of 160 ns. Different regions of the donor substrate are irradiated with an energy fluence going from 0.4 J/cm$^2$ to 3.125 J/cm$^2$ per pitch of 0.025 J/cm$^2$ and the quality of the surface of the donor substrate is evaluated by means of a "haze" measurement corresponding to the intensity of the light scattered by the surface of the layer, using the Surfscan® SP2 inspection tool of the KLA-Tencor Company.

Figure 1:
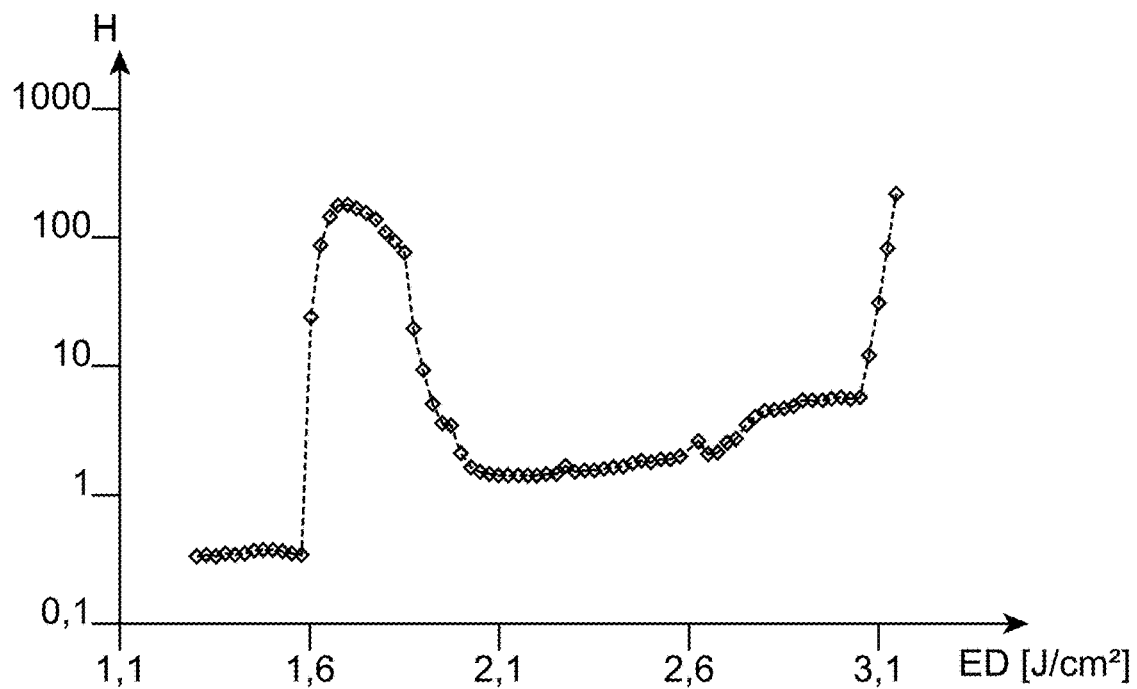
FIG. 1 represents the scattered light emitted by the surface of a silicon substrate as a function of the energy fluence of a laser pulse having irradiated it.

FIG. 1 thus represents the haze H emitted by a region of the donor substrate (in arbitrary units) as a function of the energy fluence ED (in J/cm$^2$). An intensity peak of the haze H is observed for fluences globally comprised between 1.6 and 1.9 J/cm$^2$. This peak is linked to an increase in the surface roughness due to the formation of surface structures of which the presence, observed by SEM (Scanning Electron Microscopy), may be associated with a start of fusion of the surface. Then, for fluences greater than 2 J/cm$^2$, it is again observed by SEM that a good surface quality is once again obtained, which may be linked to a recrystallisation following a total fusion of the surface in the course of the irradiation. For fluences greater than 3 J/cm$^2$, a new intensity peak of the haze H is observed and a phenomenon of surface deformation which creates craters is observed by SEM.

Figure 2:
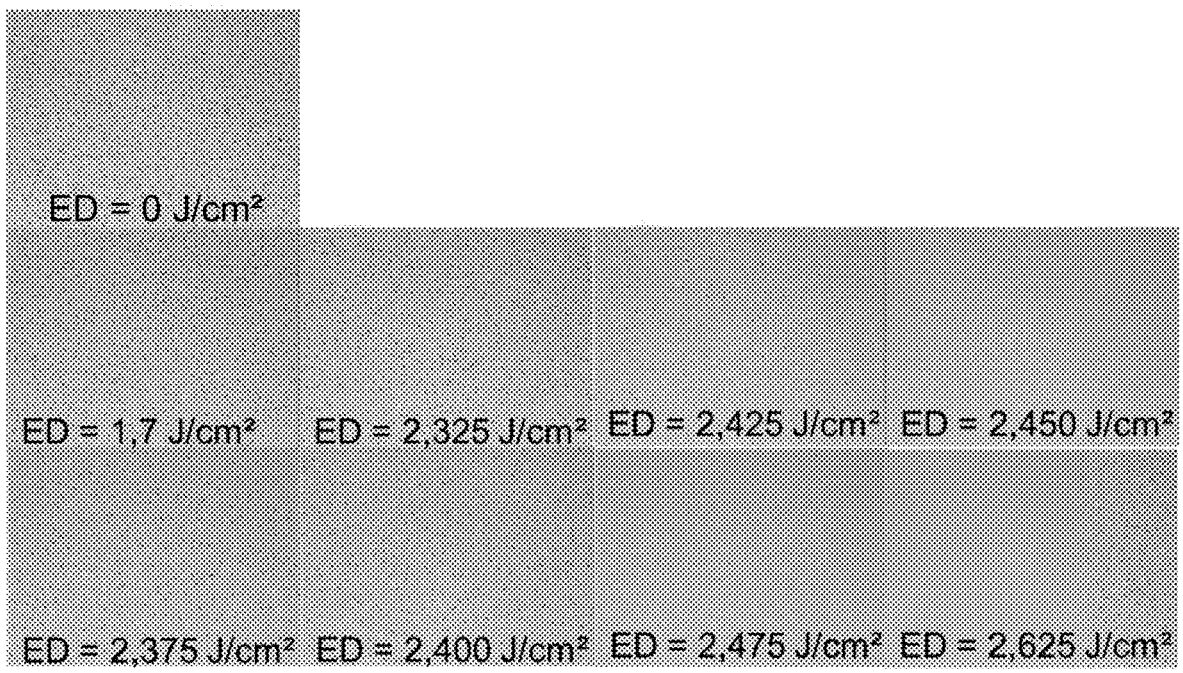
FIG. 2 represents microscopic observations of the surface of regions of a substrate subjected to different laser irradiation energy levels.

The donor substrate thereby irradiated is subjected to a thermal treatment at 500° C. for two minutes to verify the presence or the absence of blistering at the level of the different irradiated regions, and thus the possibility or not of initiating fracturing. FIG. 2 represents microscopic observations of the surface of different regions of the substrate and it is observed that the higher the fluence ED of the irradiation the more the phenomenon of blistering/exfoliation is reduced up to even being inhibited. The Inventors have for example been able to observe by SEM, on the one hand, a surface exfoliation and the presence of microfissures at the level of the embrittlement plane after an irradiation at 2.15 J/cm$^2$ (which is compatible with an initiation of the fracture) and, on the other hand, the presence of microbubbles at the level of the embrittlement plane after an irradiation at 2.75 J/cm$^2$ (which as shown in FIG. 2 does not cause blistering/exfoliation and is thus not compatible with an initiation of the fracture).

It may be deduced from the foregoing that within the framework of an irradiation by a single pulse, it is preferable not to have to resort to fluences comprised between 1.6 and 1.9 J/cm$^2$ or to fluences greater than 3 J/cm$^2$ to avoid a surface degradation but rather to favour fluences comprised between 1.9 and 3 J/cm$^2$. Within this latter range, the higher the fluence, the more the phenomenon of blistering is inhibited and thus the more the capacity for initiation of the fracture wave is reduced.

Figure 3:
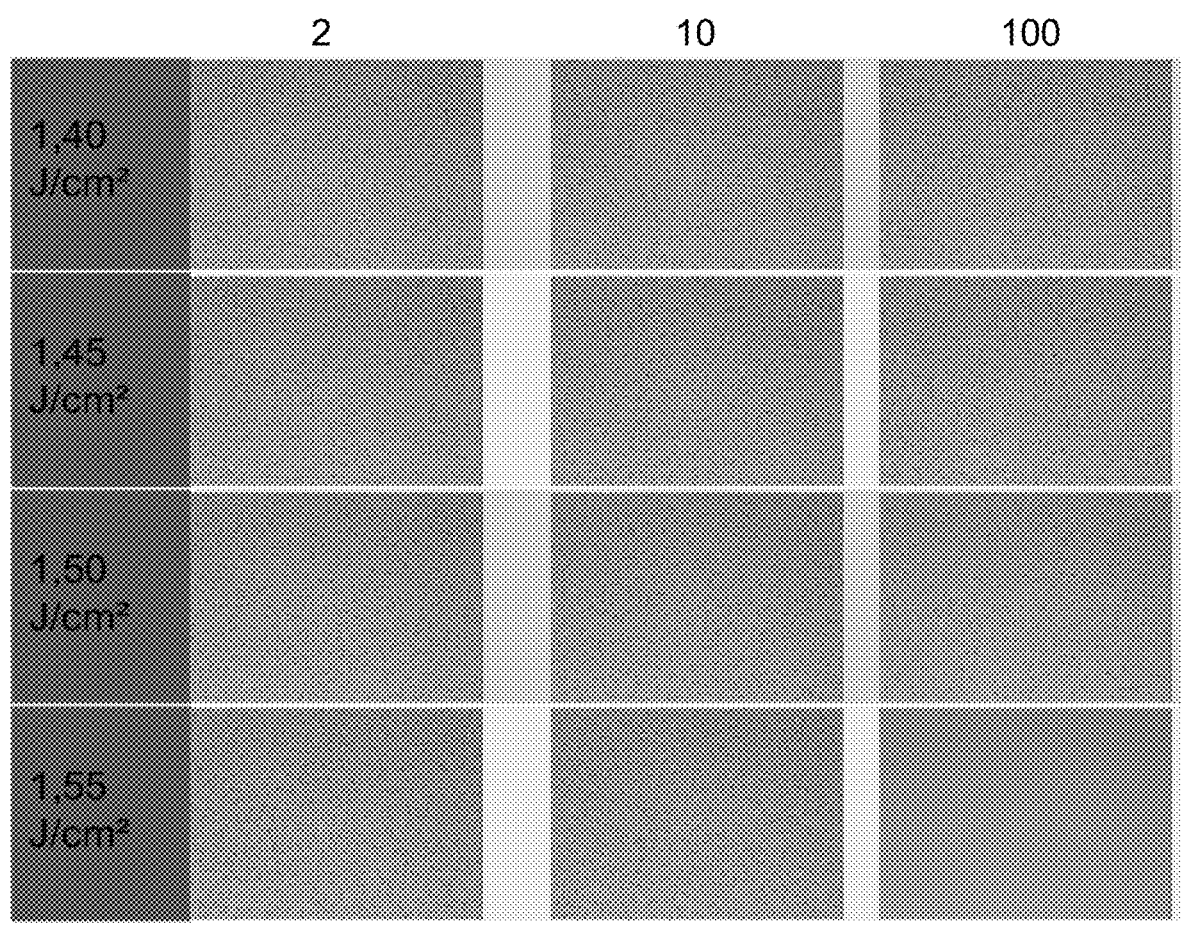
FIG. 3 represents microscopic observations of the surface of regions of a substrate subjected to different numbers of laser pulses.

In FIG. 3 are represented microscopic observations of regions irradiated by 2, 10 or 100 NSLA pulses after they have been subjected to the thermal treatment of verification of the blistering. It is observed that an increase in the number of pulses makes it possible to increase the inhibition effect. In particular, for the example of 100 pulses, the inhibition effect is pronounced as of a fluence of 1.55 J/cm$^2$.

It is clear from the foregoing that it is possible to reduce or even to inhibit blistering by using a laser annealing and that it is possible to adapt the fluence and the number of pulses to attain the desired inhibition effect. Returning to the description of the method according to the invention, said method may thus include a localised irradiation of the free face of the thin layer (i.e. its face intended to be placed in contact with the receiver substrate) by one or more laser pulses. It is obviously possible to irradiate several target zones, and even to apply different irradiation parameters (fluence and number of pulses notably) between the target zones.

Figure 4:
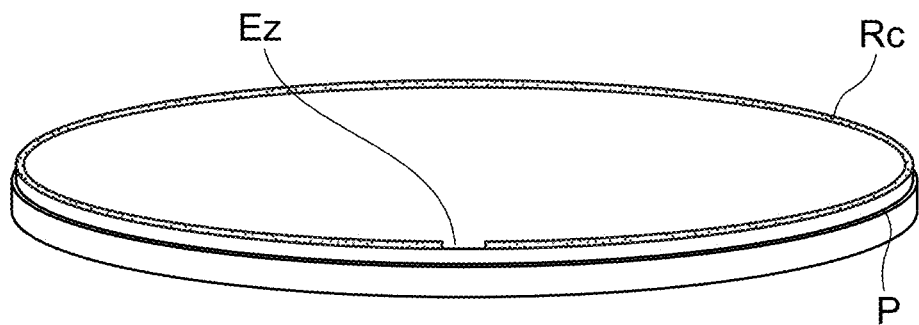
FIG. 4 illustrates a first possible embodiment of the localised reduction of the capacity of the embrittlement plane to initiate the fracture.

In a possible exemplary embodiment, during the step of localised reduction of the capacity to initiate the fracture wave, a peripheral crown of the embrittlement plane P, with the exception of a sector of the peripheral crown, is subjected to said reduction. The thickness of the peripheral crown is for example 100 μm to 10 mm, typically 500 μm to 2 mm. The sector occupies a surface comprised between 200×200 μm$^2$ and 20×20 mm$^2$ (which corresponds to an angular opening comprised between around several tenths of degrees and 10 degrees). To do so, and as illustrated by FIG. 4, a laser annealing may be applied on a peripheral target region Rc of the surface of the donor substrate corresponding to said peripheral crown with the exception of a portion Ez of this target region corresponding to said sector. Within the framework of this exemplary embodiment, the initiation of the fracture wave may include a localised input of energy (for example a localised heating) at the level of the sector of the peripheral crown not subjected to the localised reduction to initiate the fracture wave.

Figure 5:
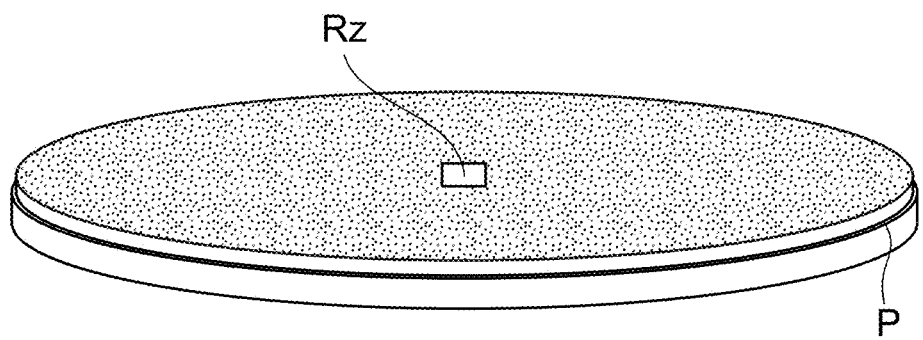
FIG. 5 illustrates a second possible embodiment of the localised reduction of the capacity of the embrittlement plane to initiate the fracture.

In another exemplary embodiment, during the step of localised reduction of the capacity to initiate the fracture wave, the whole of the embrittlement plane P is subjected to said reduction with the exception of a zone (for example a central zone which may occupy a surface comprised between 100×100 μm$^2$ and 30×30 mm$^2$) of the embrittlement plane. To do so, and as illustrated by FIG. 5, a laser annealing may be applied on the whole of the surface of the donor substrate with the exception of a region Rz corresponding to said zone. Within the framework of this example, the localised reduction of the capacity to initiate the fracture wave is preferably carried out so as not to form an obstacle to the propagation of the fracture wave. For that purpose, the laser annealing may be carried out at a fluence that does not inhibit completely the formation of microfissures and does not form exclusively microbubbles, as it has been seen in the example described previously.

Figure 6:
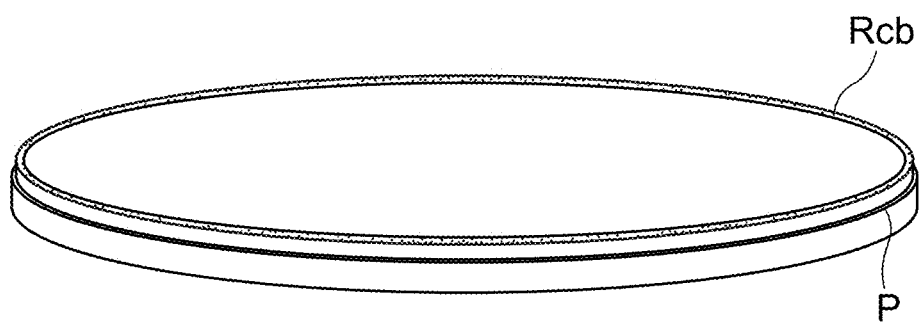
FIG. 6 illustrates a third possible embodiment of the localised reduction of the capacity of the embrittlement plane to initiate the fracture.

In another possible exemplary embodiment, during the step of localised reduction of the capacity to initiate the fracture wave, a peripheral crown of the embrittlement plane P present at the edge of the donor substrate is subjected to said reduction of the capacity of initiating the fracture wave. To do so, and as illustrated by FIG. 6, a laser annealing may be applied on the surface of the donor substrate on a peripheral target region Rcb corresponding to said peripheral crown.

The peripheral target region Rcb preferably covers the crown on the wafer edge which due to a chamfer is not bonded to the receiver substrate and is not transferred thereon. Indeed, in the absence of implementation of the invention, this non-bonded crown is the seat of blistering/exfoliation phenomena during the embrittlement thermal treatment. Defects are then generated which it is advisable to get rid of by a specific post-treatment. With the implementation of the invention, it is possible to reduce or even to eliminate these blistering/exfoliation phenomena at the level of the non-bonded crown and consequently not to have to carry out a specific post-treatment of defects that would be generated by these phenomena.

Figure 7:
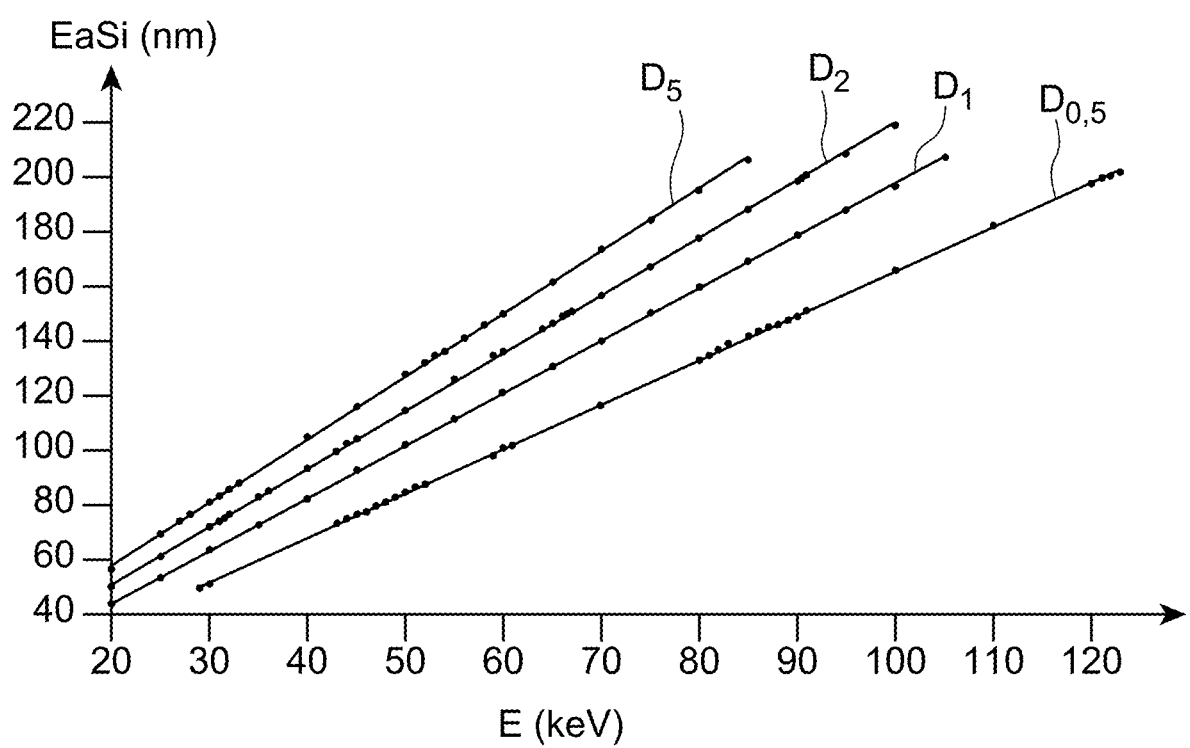
FIG. 7 represents a thickness of silicon amorphized by an implantation of silicon, as a function of different implantation conditions.

In another possible embodiment of the invention, the localised reduction of the capacity of the embrittlement plane to initiate the fracture wave may include, before or after the formation of the embrittlement plane, the formation of a localised amorphous zone in the thin layer in line with the zone where the capacity to initiate the fracture wave must be reduced. By localising an amorphous zone in the vicinity of the embrittlement plane, for example at less than 100 nm and advantageously at less than 75 nm or 50 nm from the embrittlement plane, it is possible in fact to limit or even to inhibit bubbling at the level of the zone of the embrittlement plane situated directly in line with this amorphous zone. The amorphous zone is preferably formed after the formation of the embrittlement plane so as not to interfere with this formation. The amorphous zone may be obtained by ion implantation based notably on one or more of the following species: silicon, germanium, phosphorous, arsenic, nitrogen or argon with a dose typically comprised between $10^{14}$ and $10^{16}$ at/cm$^2$. FIG. 7 represents the thickness of a zone of silicon EaSi made amorphous by means of an implantation of silicon as a function of the implantation energy E for different implantation doses ($D_{0.5}$: $5.10^{14}$ at/cm$^2$; $D_1$: $10^{15}$ at/cm$^2$; $D_2$: $2.10^{15}$ at/cm$^2$; $D_5$: $5.10^{15}$ at/cm$^2$).

What is claimed is:

1. A method for transferring a thin layer from a donor substrate to a receiver substrate, the method including the steps of:
    implanting species in a uniform manner on the whole area of the donor substrate to form therein an embrittlement plane which delimits the thin layer and a bulk part of the donor substrate,
    after implanting the species, locally treating an area of the whole area of the embrittlement plane to reduce a capacity of the embrittlement plane to initiate a fracture wave in the locally treated area,
    after locally treating, placing in contact the donor substrate and the receiver substrate,
    initiating and propagating the fracture wave along the embrittlement plane.

2. The method according to claim 1, in which, during the step of locally treating, a central zone (Rz) of the embrittlement plane is not subjected to the reduction of the capacity to initiate the fracture wave.

3. The method according to claim 1, wherein the locally treated area is a peripheral crown of the embrittlement plane.

4. The method according to claim 3, in which the peripheral crown is localised at the edge of the embrittlement plane.

5. The method according to claim 1, wherein the locally treated area is a peripheral crown of the embrittlement plane, with the exception of a sector of the peripheral crown.

6. The method according to claim 5, in which initiating the fracture wave includes locally inputting energy at the level of the sector of the peripheral crown not subjected to the reduction of the capacity to initiate the fracture wave.

7. The method according claim 1, in which the step of locally treating includes carrying out a localised laser annealing of the donor substrate.

8. The method according to claim 7, in which carrying out the localised laser annealing of the donor substrate includes locally irradiating a free face of the thin layer by one or more laser pulses.

9. The method according to claim 1, in which the step of locally treating includes forming a localised amorphous zone in the thin layer.

10. The method according to claim 9, in which the amorphous zone is localised at less than 100 nm from the embrittlement plane.

11. The method according to claim 10, in which the amorphous zone is localised at less than 75 nm from the embrittlement plane.

12. The method according to claim 10, in which the amorphous zone is localised at less than 50 nm from the embrittlement plane.

* * * * *